United States Patent [19]

Katsuraoka

[11] Patent Number: 5,117,281
[45] Date of Patent: May 26, 1992

[54] SEMICONDUCTOR DEVICE HAVING A HEAT-SINK ATTACHED THERETO

[75] Inventor: Kiyoshi Katsuraoka, Tokyo, Japan

[73] Assignee: NEC Corporation, Japan

[21] Appl. No.: 601,415

[22] Filed: Oct. 22, 1990

[30] Foreign Application Priority Data

Oct. 23, 1989 [JP] Japan .................................. 1-276833

[51] Int. Cl.⁵ ..................... H01L 23/02; H01L 23/12; H02B 1/00; H05K 7/20
[52] U.S. Cl. ......................................... 357/81; 357/74; 357/80; 361/383; 361/384; 361/389
[58] Field of Search ....................... 357/81, 74, 72, 70; 361/383, 384, 389

[56] References Cited

U.S. PATENT DOCUMENTS 4,561,011 12/1985 Kohara et al. ........................ 357/81
4,649,990 3/1987 Kurihara et al. ..................... 357/81

Primary Examiner—Andrew J. James
Assistant Examiner—Carl Whitehead, Jr.
Attorney, Agent, or Firm—Laff, Whitesel, Conte & Saret

[57] ABSTRACT

A heat-sink is attached to a hermetic seal package of a face-up type semiconductor device such that a concavity is formed between the cap of the package and the heat-sink. Small holes using a vent are formed in the heat-sink between the concavity and the outside face of the heat-sink so as to communicate atmosphere outside the heat-sink to the concavity.

10 Claims, 3 Drawing Sheets

SEMICONDUCTOR DEVICE HAVING A HEAT-SINK ATTACHED THERETO

BACKGROUND OF THE INVENTION

The present invention relates to a semiconductor device having a heat-sink attached thereto, and more particularly, to an attachment configuration of a heat-sink to a package of a semiconductor device.

In most instances, heat-sinks, that is, heat radiators are attached to packages of semiconductor devices to efficiently disperse heat generated in semiconductor chips installed in the packages thereby cooling the chips. Typically, the heat-sink is favourably installed in a so-called face-down semiconductor device because of its easy attachment. The face-down type device, however, restricts the number of the outer leads which are led out from the package because the leading-out portion of the package is limited to a periphery of its planar surface. On the other hand, a recent progress on functions of a semiconductor chip has brought about increase in necessary number of outer leads. To meet this demand, a so-called face-up type semiconductor device is more convenient because the outer leads can be led out from the all parts of one plane surface of the package. In the face-up type device, a heat-sink is attached to peripheral parts of the other planar surface of the package, and to transfer the heat from the package to the heat-sink with a conductance as high as possible, the heat-sink would be attached all around as if a closed cavity is formed between the center of the package and that of the heat-sink. In a view of the reduction in manufacturing cost of the device, usage of resin as adhesive between the heat-sink and the package is beneficial.

The process for fabricating the above-mentioned heat-sink attached semiconductor device comprises the step of attaching a heat-sink to a package with a resin placed between them, which needs a cure step of the resin at a high temperature to provide good adhesion.

This cure is carried out in such a condition that the resin is placed between the planar attachment surface of the heat-sink and the package to allow a cavity defined by the heat-sink and the package. Thus during the cure period, the pressure inside the cavity may be increased to a degree to force the molten resin outwards with a result in making the adhesion for the attachment thinner and smaller in strength at parts thereof which are randomly positioned or in bringing about a burst at parts randomly positioned. Such the uneven adhesion decreases the adhesive strength and lowers the heat dissipation effect thereby impairing the product reliability.

SUMMARY OF THE INVENTION

Accordingly, it is an object of the present invention to provide a semiconductor device in which a heat-sink can be attached to a package of a face-up type using resin as adhesive with a predetermined and even strength.

According to the present invention, there is provided a semiconductor device which comprises a package, a semiconductor element installed in the package and a heat-sink bonded to the package by resin. The package includes a pedestal body having a recess portion, a first planar surface surrounding the recess portion in which the semiconductor element is installed and a second planar surface positioned at the opposite side to the first plane surface, a plurality of outer leads leading out from the second planar surface, and a cup sealing the recess portion hermetically. The heat-sink includes a planar surface at one side, a concavity depressed from the planar surface and surrounded by the planar surface, and small holes penetrating a member of the heat-sink constituting the concavity so that the small holes communicate atmosphere outside the heat-sink to the concavity. The heat-sink is attached at its planar surface to the first plane surface of the pedestal body of the package by resin.

DESCRIPTION OF THE PRIOR ART

Figure 1:
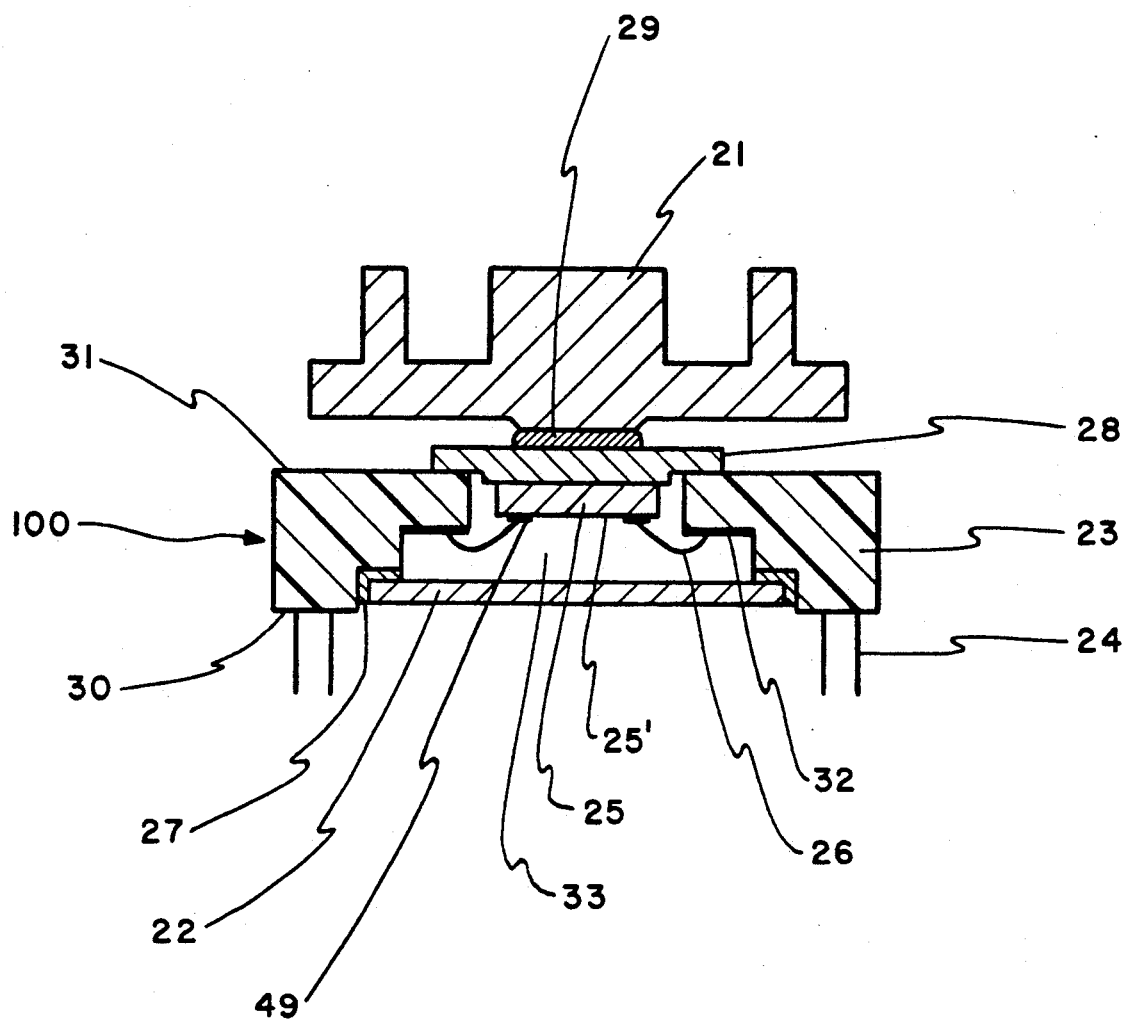
FIG. 1 is a cross-sectional view of a face-down type semiconductor device in the prior art.

Referring to FIG. 1, a conventional face-down type semiconductor device will be explained. A package 100 comprises a ceramic body 23, a metal plate 28 attached to a first planar surface 31 of the ceramic body and sealing one side of a cavity 33 of the ceramic body, metalized inner electrodes 32 formed on the ceramic body 23 within the cavity 33, a weld ring 27 attached to the ceramic body, a metal cap 22 welded with the weld ring 27 to seal the cavity 33 hermetically, and outer leads, that is, lead pins 24 leading out from a second planar surface 30 of the ceramic body 23. An IC chip 25 is die-bonded to the metal plate 28, and electrode terminals 49 of the IC chip and the metalized inner electrodes 32 are connected to each other by wire bonding of this metal wires 26. The surfaces 25' of the IC chip 25 faces to the same direction as that of the outer leads 24 leading out, and such the device is called as face-down type. A heat-sink 21 is attached to the metal plate 28 by solder 29. Since the second planar surface 30 is limited to the peripheral part of the ceramic body as shown in FIG. 1, the number of the outer leads are restricted to some extent.

DETAILED DESCRIPTION OF THE EMBODIMENTS

Figure 2B:
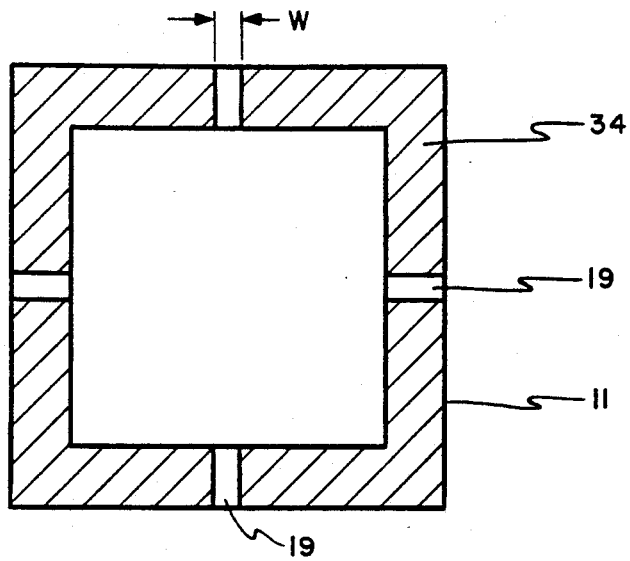
FIG. 2B is a cross-sectional view of the heat-sink taken along line B—B' in FIG. 2A as viewed in the direction of arrows.
Figure 2A:
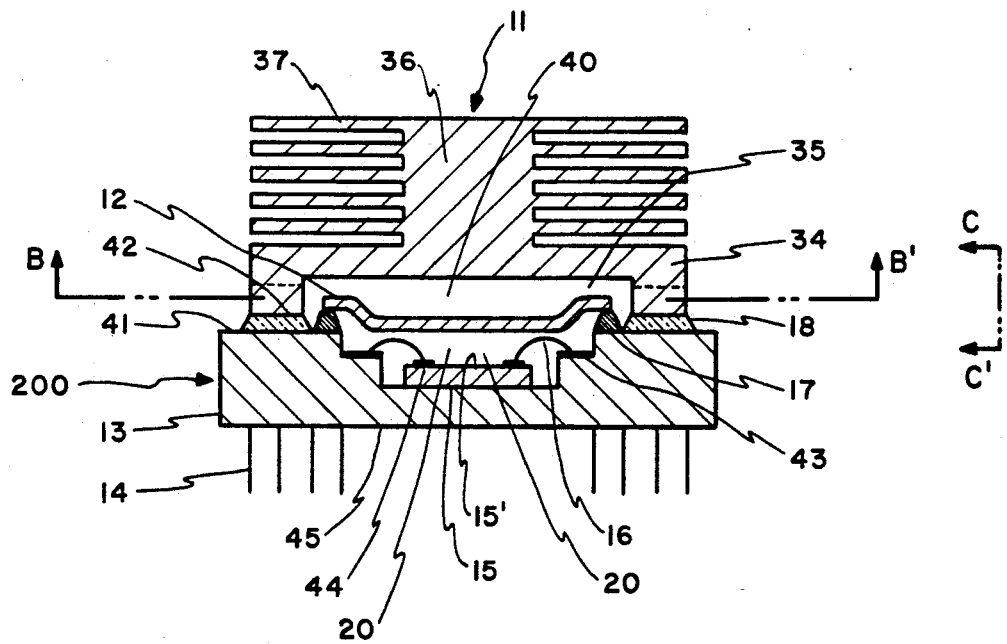
FIG. 2A is a cross-sectional view of a first embodiment of the present invention.
Figure 2C:
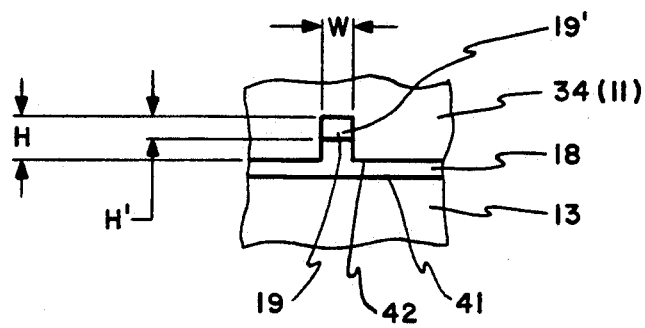
FIG. 2C is a side view as viewed in the direction of arrows of line C—C' in FIG. 2A.

Referring to FIGS. 2A to 2C, a first embodiment of the present invention will be explained. A package 200 comprises a pedestal ceramic body 13 of alumina having a recess (cavity) portion 20, a first planar surface 41 surrounding the recess portion 20 and a second planar surface 45, a plurality of outer leads, that is, lead pins 14 leading out from the second plane surface 45, metalized inner electrodes 43 formed on the ceramic body 13 within the recess portion 20, a weld ring 17 attached to the ceramic body 13 and a metal cap 12 welded with the weld ring 17 to seal the recess portion 20 hermetically. The second planar surface 45 extends from the periphery to the center of the ceramic body 13 entirely. Therefore, a large number of the outer leads 14 can be installed. A semiconductor element 15 (IC chip) is die-bonded to the ceramic body 13 within the recess portion 20, and electrode terminals 44 of the semiconductor element 15 and the metalized inner electrodes 43 are connected to each other by wire bonding of thin metal wires 16. The surface 15' of the semiconductor element 15 faces to the opposite direction to that of the outer leads 14 leading out, and such the device is called as face-up type. A heat-sink 11 made of aluminum or aluminum series alloy comprises a wall part 34 of ring plan shape of 40 mm × 40 mm at the inner side and of 1 to 2 mm height having a planar surface 42 at one end, and a plate part 35 continuously formed from the other and of the wall part 34. The wall part 34 and the plate part 35 constitute a concavity 40 which is depressed from and surrounded by the planar surface 42. The heat-sink 11 further comprise a bar part 36 continuously formed from the plate part 35 and a plurality of cooling fins 37 connected to the bar part 36. In this first embodiment, four grooves 19 are formed at the wall part from the planar surface 42 inward at the center of every straight wall line of the ring plan shape as shown in FIG. 2B. Each groove 19 has a width W ranging from 1.5 mm to 3.0 mm, and a height H of about 1.0 mm. The heat-sink 11 is attached to the package 200 by holding the planar surface 42 of the heat-sink 11 and the first palnar surface 41 of the package 200 using silicone resin 18 as adhesive. After a cure step of 150° C. to 160° C. temperature under a weight (not shown) from the upper surface (FIG. 2A) of the heat-sink, the thickness of the silicone resin 18 becomes 0.1 mm except the groove portions. At the groove 19, the silicone resin 18 goes up by about 0.5 mm. Therefore, four small holes 19' each having an area of W (1.5 mm to 3.0 mm) × H' (about 0.5 mm) and each constituted by the three side walls of the aluminum wall 34 and one side wall of the silicone resin 18 are formed. In the first embodiment, four grooves 19 are provided. However, practically, the number of grooves may be two to six.

The grooves 19 or the resultant holes 19' act as an air vent for the cave defined by the metal cap 12 and the heat-sink 11 so as to prevent the attachment of heat-sink 11 to a package 200 from causing the pressure inside the cave to rise during curing of the resin 18, and thus without inducing uneven adhesion for the attachment. The attachment of the heat-sink 11 to the package 200 with the resin 18 placed between them therefore can be accomplished without lowering in adhesive strength and in heat dissipation effect of the heat-sink.

Figure 3B:
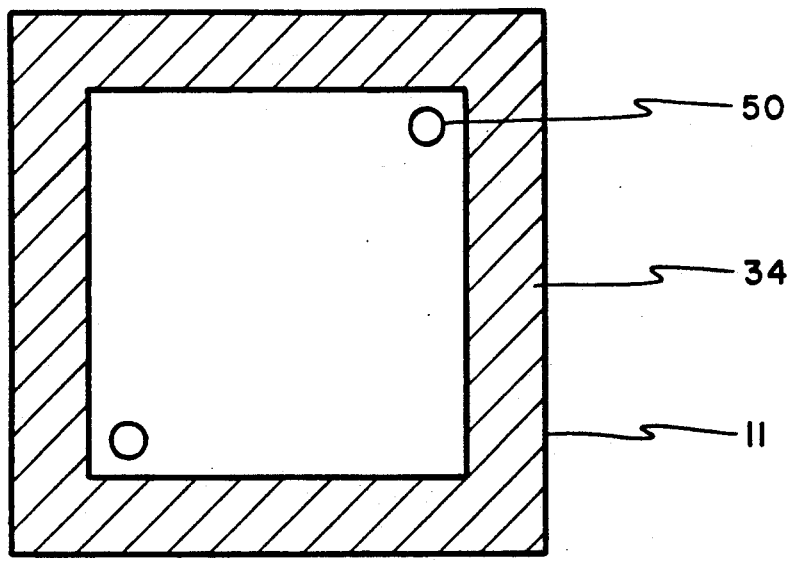
FIG. 3B is a cross-sectional view of the heat-sink taken along line B—B' in FIG. 3A as viewed in the direction of arrows.
Figure 3A:
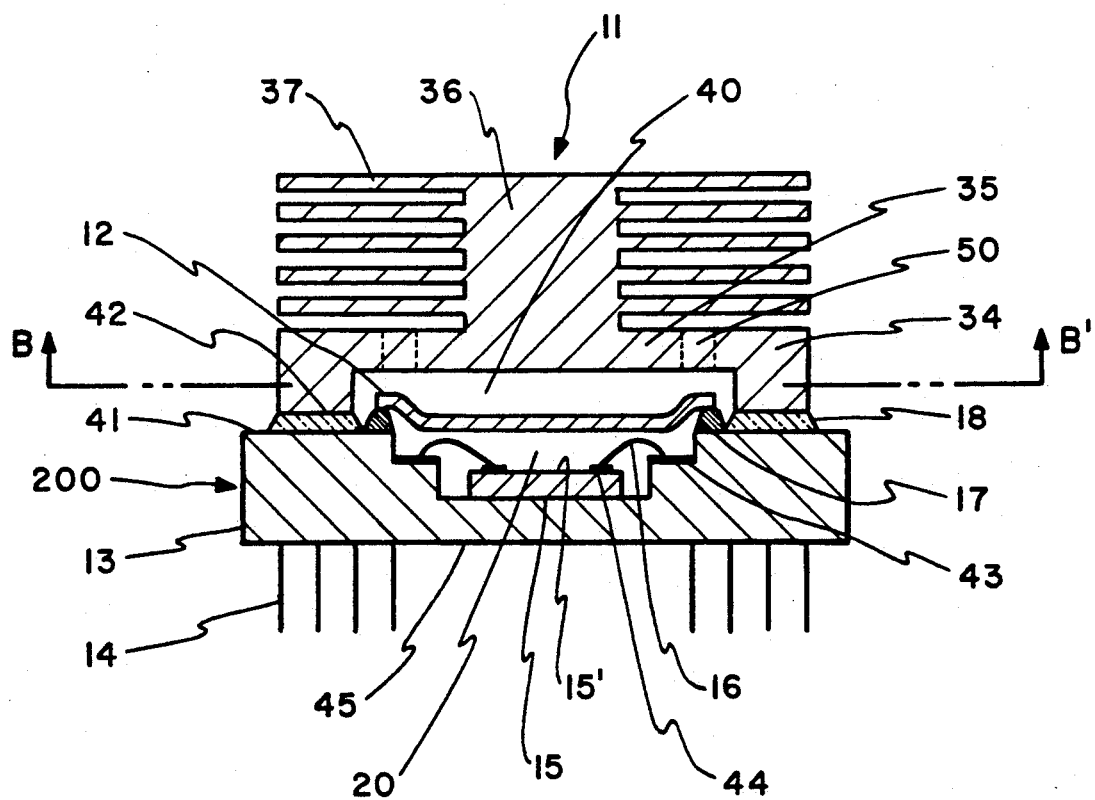
FIG. 3A is a cross-sectional view of a second embodiment of the present invention.

FIGS. 3A and 3B show a second embodiment of the present invention, and in FIGS. 3A and 3B, the same components as those in FIGS. 2A to 2C are indicated by the same reference numerals. This embodiment is the same as the first embodiment except that the heat sink 11 is provided with through-holes 50 of 1.5 to 3.0 mm diameter instead of the grooves. This structure permits large attachment surface of the heat sink compared with the first embodiment,a nd thereby further improvement in the heat dissipation effect and in the adhesive strength of the heat sink can be attained. In the second embodiment, two holes 50 are shown. However, in practical use, two to six of holes 50 or of holes 50 and grooves 19 (in FIG. 2) are useful.

The present invention provides a simple structural feature of heat-sink provided with grooves or through-holes, thereby preventing uneven adhesion for the attachment or burst from happening in the step of attaching a heat-sink to a package with a resin placed between them, and thus has advantage of improving attachment strength and heat dissipation effect of heat sink and thus increasing reliability of products.

What is claimed is:

1. A semiconductor device comprising:
    a pedestal body of a package including a first planar surface at one side of said pedestal body, a second planar surface at another side of said pedestal body which is opposite to said first planar surface, and a recess formed at a center part of said one side of said pedestal body, said recess being depressed from said first planar surface and surrounded by first planar surface, said first planar surface having an inner section near said recess and surrounding said recess, and an outer section remoter from said recess via said inner section and surrounding said inner section;
    a semiconductor element installed in said recess of said pedestal body;
    a cap of said package bonded to said inner section of said first planar surface of said pedestal body to hermetically seal said recess;
    resin;
    a heat-sink including a planar surface at one side, a concavity formed at one side, said concavity being depressed from said planar surface and surrounded by said planar surface, said planar surface of said heat-sink being bonded to said outer section of said first planar surface of said pedestal body by said resin such that an enclosed space is formed by said concavity of said heat-sink and said package including said cap and
    a plurality of small holes penetrating a member of said heat-sink constituting said concavity and reaching said concavity so that said small holes communicate between an atmosphere outside said heat-sink and said enclosed space constituted of said concavity of said heat-sink and said package including said cap.

2. A semiconductor device of claim 1, in which the side wall of said small hole is entirely made of said member of said heat-sink.

3. A semiconductor device of claim 2, in which said small hole has a diameter ranging from 1.5 mm to 3.0 mm 4. A semiconductor device of claim 1, in which the side wall of said small hole is made of said member of said heat-sink and of said resin.

5. A semiconductor device of claim 4, in which said small hole has a width in a direction in parallel with said planar surface of said heat-sink ranging from 1.5 mm to 3.0 mm.

6. A semiconductor device of claim 1, in which a number of said small holes is two or more and six or less.

7. A semiconductor device of claim 1, in which said resin is silicone resin.

8. A semiconductor device of claim 1, in which said heat-sink is made of aluminum or aluminum series alloy.

9. A semiconductor device of claim 1, in which said pedestal body is made of ceramic.

10. A semiconductor device of claim 9, in which ceramic is alumina.

* * * * *